United States Patent [19]

Reintjes et al.

[11] Patent Number: 4,508,755
[45] Date of Patent: Apr. 2, 1985

[54] METHOD OF APPLYING A LAYER OF CONDUCTIVE INK

[75] Inventors: Anthony B. Reintjes, Dorchester; Robert J. Fleming, St. Thomas; Bev W. T. Gumb, London, all of Canada

[73] Assignee: Northern Telecom Limited, Montreal, Canada

[21] Appl. No.: 480,217

[22] Filed: Mar. 30, 1983

[51] Int. Cl.³ .................... B05D 5/12; B41F 17/00
[52] U.S. Cl. .................................... 427/58; 427/79; 427/122; 101/35; 101/41
[58] Field of Search .................. 427/58, 79, 122; 29/592 E, 594; 101/41, 35

[56] References Cited

U.S. PATENT DOCUMENTS 3,701,317 10/1972 Miyamoto .................... 101/41
4,249,043 2/1981 Morgan et al. .............. 29/594
4,382,328 5/1983 Janszen ......................... 29/594
4,389,459 6/1983 Mirra et al. ................. 427/122
4,403,547 9/1983 Forberger .................... 101/41

Primary Examiner—J. E. Kittle
Assistant Examiner—James J. Seidleck
Attorney, Agent, or Firm—Sidney T. Jelly

[57] ABSTRACT

Electret transducers, for example microphones, have a backplate which is metallized on one surface, the metallized surface forming one side of a capacitor. A frame sits on the metallized tape to hold the tape taut over the backplate. Metal connections are made to the backplate and frame to complete the circuit. The metallization is conventionally formed by vapor deposition of aluminum. This is a lengthy and relatively expensive process. Also the metallization can give rise to galvanic problems. The invention prints a pattern of conductive ink on the various parts. Good contact is obtained, galvanic action avoided and a reduction in manufacturing costs occurs. Simplified assembly is also obtained.

5 Claims, 4 Drawing Figures

METHOD OF APPLYING A LAYER OF CONDUCTIVE INK

This invention is concerned with the provision of electrically conductive coatings, or layers, on members for electret devices. The invention is concerned with the use of conductive graphite filled ink as a conductive film or layer on the backplate of an electret transducer, replacing a metallized layer. The invention is also concerned with the use of a conductive graphite filled ink at one end of the frame avoiding the use of a metal clip to provide an electrical connection. Particularly, the invention is concerned with the application of the ink by transfer stamping or printing.

In accordance with the invention, a die having a shallow recess corresponding to the pattern to be transferred is provided. Ink is applied to the die, filling the recess, and the excess cleaned off. A resilient ball-ended member is pressed down on the die and then pressed down on the member to be coated or printed. The ball-ended member is sufficiently deformable that surfaces that are not flat can be printed and also some edge wraparound occurs so that the ink coating or layer can be caused to extend down the side edge of a member. In a backplate, two surfaces inclined in a very shallow Vee are printed and the ink pattern can be extended to the edge of the backplate, and even down one side. In a frame, the ink can be applied to one end of the frame, the ink extending on one surface and one edge.

The invention will be readily understood by the following description of certain embodiments, by way of example, in conjunction with the accompanying drawings, in which.

Figure 1:
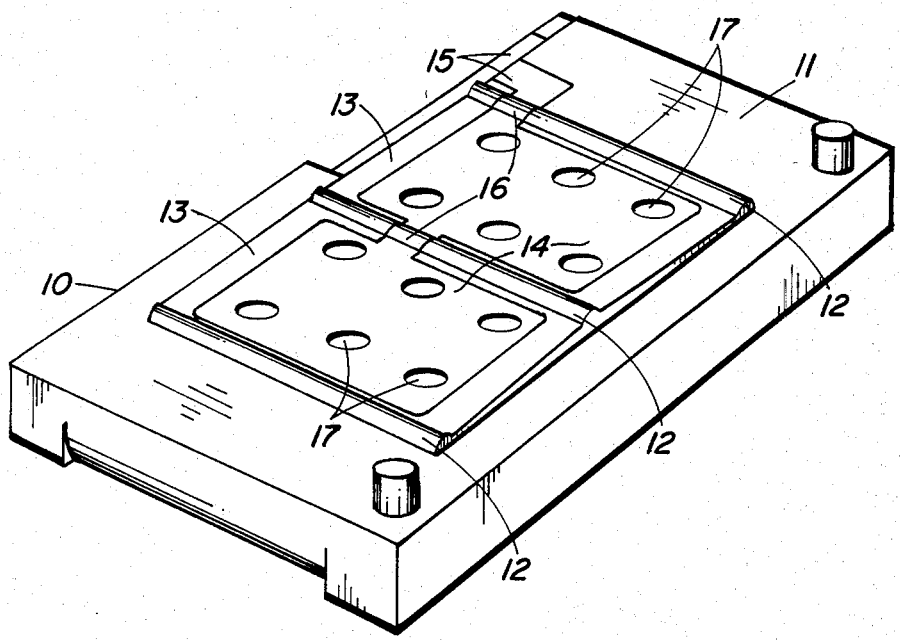
FIG. 1 is a perspective view of a backplate.

FIG. 1 illustrates a backplate 10, the front surface 11 of which forms one member of a capacitor, the other member being a flexible membrane, as described later. The capacitor so formed is referred to as an electret, or electret transducer. On the front surface 11 are formed three spaced, parallel, ribs 12. The center rib is somewhat higher than the outer ribs, and the ribs are joined by slightly inclined surfaces 13, which form a very shallow Vee.

On each surface 13 is formed a conductive layer 14, conventionally metal. A conductive path 15 extends to one side of the backplate to provide a contact area, the path 15 and the two conductive layers 14 being connected by narrow conductors 16 extending over the center and are outer ribs. Holes 17 are formed through the backplate.

Conventionally the conductive layers 14, path 15 and connectors 16 are formed by vapour depositions of aluminum. In accordance with the invention, these items, layers 14, path 15 and connections 16, are formed of a conductive graphite filled ink, applied by transfer stamping or printing.

Figure 2:
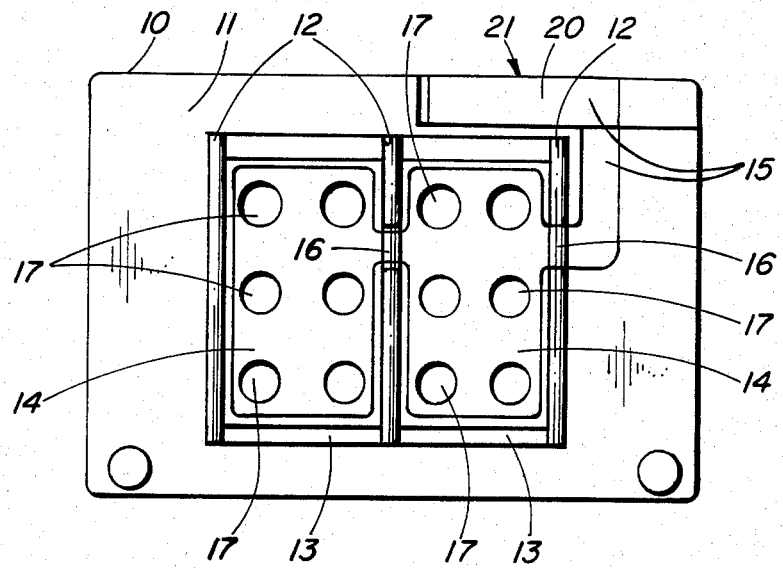
FIG. 2 is a plan view of the front surface of the backplate of FIG. 1, showing the conductive coating.

FIG. 2 is a plan view of a backplate showing more clearly the various conductive parts of the overall pattern.

The pattern is applied by making a die with a shallow recess which conforms to the pattern. The recess is filled with ink, as by a roller, and excess wiped off. A resilient ball-shaped member is then pressed down on to the dies, picking up ink, and then transferred over to a backplate, the ball-shaped member pressing down on the backplate. The ball-ended member is very flexible, for example of silicon rubber and prints over the ribs 12 and adapts to the inclination of the surfaces 13. The recess shape will not necessrily be exactly the same shape as the plan form of the final printed pattern; some variation may be necessary to account for the distortion of the ball-ended member as it prints, or stamps, over the ribs and adjusts for the inclined surfaces 13.

Previously, a conductor was attached to the contact area 20 by the use of a conductive epoxy resin. A development of the invention is to extend the conductive ink down the edge of the backplate, at 21. The ball-shaped member can be sufficiently flexible and resilient that it will deform around the edge of the backplate and deposit ink on the edge. A metal contact clip can then be used to make contact with the edge of the backplate.

The transfer printing or stamping process is conventional for printing or stamping designs in color. The invention extends the process to the printing of conductive inks to form conductive coatings and patterns. The use of a graphite filled ink avoids galvanic action which can arise with aluminum and provides a freedom of choice of metals for other parts associated with the backplate. It is quicker and cheaper to transfer print than to evaporate aluminum. It is also easier, and cheaper, making contact on the edge of the backplate by a metal contact clip than attaching a conductor by a conductive epoxy resin. The conductor attached by the epoxy resin still requires connecting to the circuit at some later time.

Various inks can be used. Two typical inks are a 426 SS ink supplied by Acheson Colloids Company, and is a combination of silver and graphite in a binder, with a solvent. Another ink is a 423 SS ink supplied by Acheson Colloids Company, which is graphite in a binder and solvent. The ink is quick drying and a solvent can be picked which etches slightly into the plastic material of the backplate, to give very good adhesion. Such a solvent is cyclohexanone.

Figure 3:
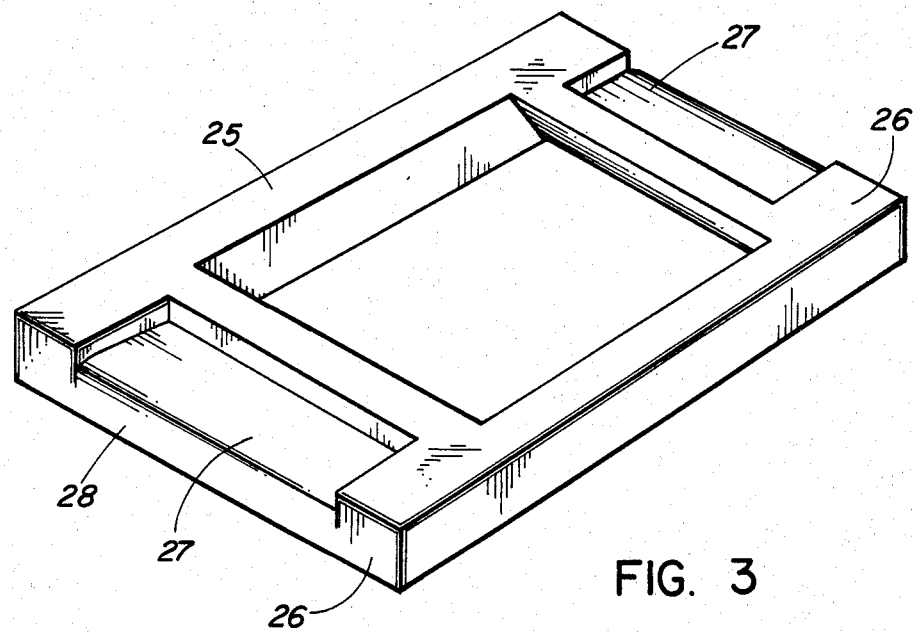
FIG. 3 is a perspective view of a frame.

FIG. 3 illustrates a frame 25, which is used in conjunction with the backplate, and other members, in an electret transducer. The metallized tape which forms the other member of the capacitor, wraps around the ends of the frame. It is necessary to make electrical contact with the metallized layer and conventionally this is done by providing a metal clip which is fitted on to one end of the frame prior to assembly of the transducer. This clip is very small and fragile and is difficult to handle and assemble to the frame.

The invention is used to provide a coating or layer of conductive ink on one end of the frame. As illustrated in FIG. 3, the ends 26 of the frame are recessed, at 27. In a feature of the invention, the surface of one of the recesses 27 and the end surface 28 associated with that recess are coated with a conductive ink in the same manner as for the backplate. The flexibility of the ball-shaped member will print both on the surface of the recess and on the end surface 28, by a wrap-around flexing of the ball-shaped member.

Figure 4:
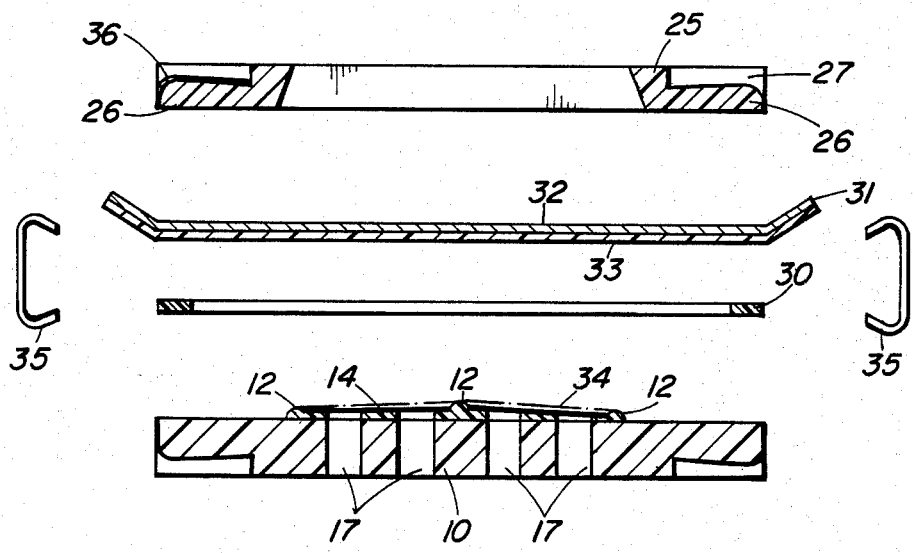
FIG. 4 is an exploded cross-section, somewhat diagrammatic, through an electret embodying the backplate of FIGS. 1 and 2 and the frame of FIG. 3.

FIG. 4 illustrates, in exploded view, the various parts of an electret transducer, items common to FIGS. 1, 2 and 3 being given common reference numerals.

A flexible, insulating spacer 30 is positioned on the backplate 10 and then the metallized flexible strip 31, having a metallic layer 32 on an insulating support 33, is stretched over. The position of the strip 31 on final assembly is indicated by the chain dotted line 34. The frame 25 is positioned on the strip and backplate and the strip folded over the ends 26 of the frame. Spring clips 35 are pressed on at each end to hold the assembly together to maintain the strip 31 taut. Seen in FIG. 4 is the printed conductive ink layer or coating at one end of the frame, indicated at 36. It will be seen that the metallized layer on the strip 31 will make contact with the coating 36 on assembly. A conductor is attached to the coating 36.

The invention provides quicker and easier application of the conductive patterns, eases attachment of connectors, and the final product, the electret transducer has improved performance. Galvanic action is also avoided, such action creating problems when aluminum metallizing is used.

What is claimed is:

1. A method of applying a layer of conductive ink in a predetermined pattern on a plastic backplate of an electret transducer, said backplate having a non-planar front surface, a side edge, a recessed portion at one end and an end surface associated with said recess, said predetermined pattern extending into said recess comprising;

filling a recess in a die with conductive ink, the recess having a shape related to said predetermined pattern;

positioning said plastic backplate at a position relative to said recess in said die;

pressing a resilient ball-ended member on to said die, over said recess in said die;

pressing said ball-ended member on to said plastic backplate and deforming the ball end of the ball-ended member into contact for the entire predetermined pattern on said non-planar surface, down said side edge into contact with a surface in said recess in the backplate, and into contact with said end surface, whereby the ink picked up by the ball end from said recess in said die is transferred to said non-planar surface, including said side edge, said surface in said recess in said backplate and said end surface.

2. A method as claimed in claim 1, the ink being a combination of silver and graphite in a binder with a solvent.

3. A method as claimed in claim 2, the solvent being one which etches slightly into the plastic member.

4. A method as claimed in claim 1, the ink being graphite in a binder with a solvent.

5. A method as claimed in claim 4, the solvent being one which etches slightly into the plastic member.

* * * * *